(12) United States Patent
Verma et al.

(10) Patent No.: US 8,637,370 B2
(45) Date of Patent: Jan. 28, 2014

(54) INTEGRATION OF TRENCH MOS WITH LOW VOLTAGE INTEGRATED CIRCUITS

(75) Inventors: Purakh Raj Verma, Singapore (SG); Yi Liang, Singapore (SG); Dong Yemin, Singapore (SG)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 57 days.

(21) Appl. No.: 13/354,158

(22) Filed: Jan. 19, 2012

(65) Prior Publication Data
US 2013/0187224 A1 Jul. 25, 2013

(51) Int. Cl.
*H01L 21/8234* (2006.01)
*H01L 21/8238* (2006.01)
*H01L 21/336* (2006.01)
*H01L 29/66* (2006.01)
*H01L 21/70* (2006.01)

(52) U.S. Cl.
USPC ........... 438/275; 438/209; 438/221; 438/270; 257/334; 257/338; 257/341; 257/343; 257/500; 257/337; 257/244; 257/238; 257/E27.001; 257/E21.417

(58) Field of Classification Search
USPC ......... 257/337, 244, 328, 329, 330, 334, 335, 257/338, 341, 343, 500, 506, E27.001, 257/E21.417, E27.06; 438/209, 221, 270, 438/275
See application file for complete search history.

(56) References Cited

U.S. PATENT DOCUMENTS

| 4,914,058 | A | * | 4/1990 | Blanchard | 438/270 |
| 5,434,435 | A |   | 7/1995 | Baliga |   |
| 6,800,904 | B2 | * | 10/2004 | Fujishima et al. | 257/343 |
| 7,365,392 | B2 |   | 4/2008 | Sugi et al. |   |
| 7,858,478 | B2 | * | 12/2010 | Hirler | 438/270 |
| 2009/0108338 | A1 |   | 4/2009 | Hshieh |   |
| 2011/0127602 | A1 |   | 6/2011 | Mallikarjunaswamy |   |
| 2013/0069144 | A1 | * | 3/2013 | Mathew et al. | 257/330 |

OTHER PUBLICATIONS

"An Optimized Resurf" LDMOS Power Device Module Compatible with Advanced Logic Processes" Efland et al.;1992 IEEE; pp. 237-240.

* cited by examiner

*Primary Examiner* — Chuong A Luu
*Assistant Examiner* — Cory Eskridge
(74) *Attorney, Agent, or Firm* — Ditthavong Mori & Steiner, P.C.

(57) ABSTRACT

A high voltage trench MOS and its integration with low voltage integrated circuits is provided. Embodiments include forming, in a substrate, a first trench with a first oxide layer on side surfaces, a narrower second trench, below the first trench with a second oxide layer on side and bottom surfaces, and spacers on sides of the first and second trenches; removing a portion of the second oxide layer from the bottom surface of the second trench between the spacers; filling the first and second trenches with a first poly-silicon to form a drain region; removing the spacers, exposing side surfaces of the first poly-silicon; forming a third oxide layer on side and top surfaces of the first poly-silicon; and filling a remainder of the first and second trenches with a second poly-silicon to form a gate region on each side of the drain region.

8 Claims, 11 Drawing Sheets

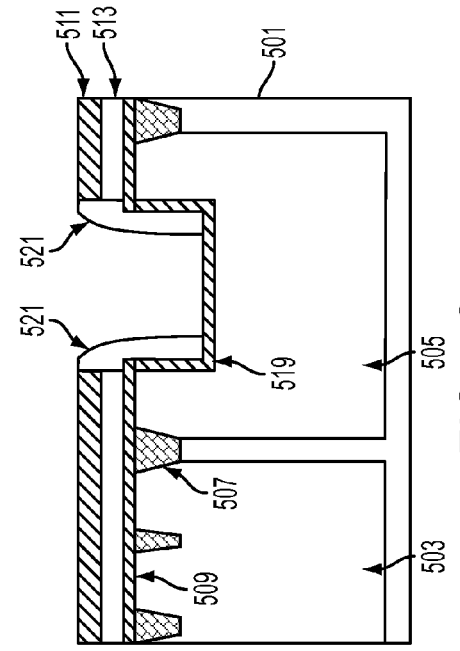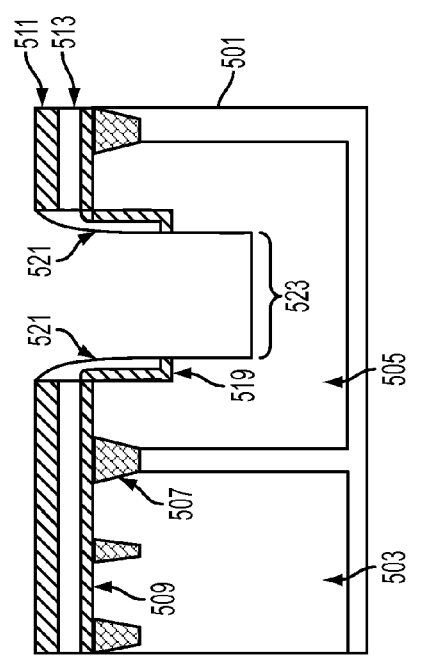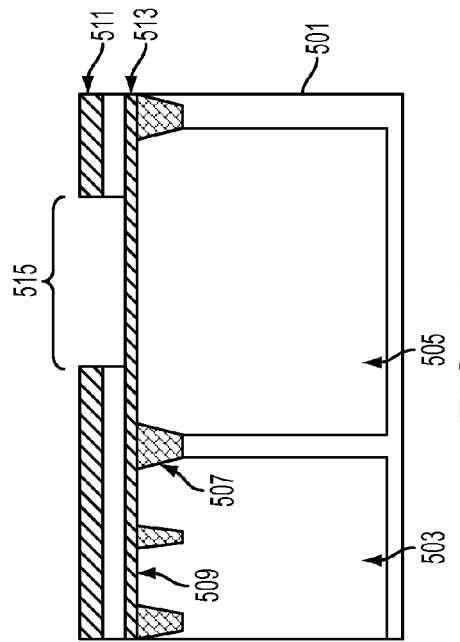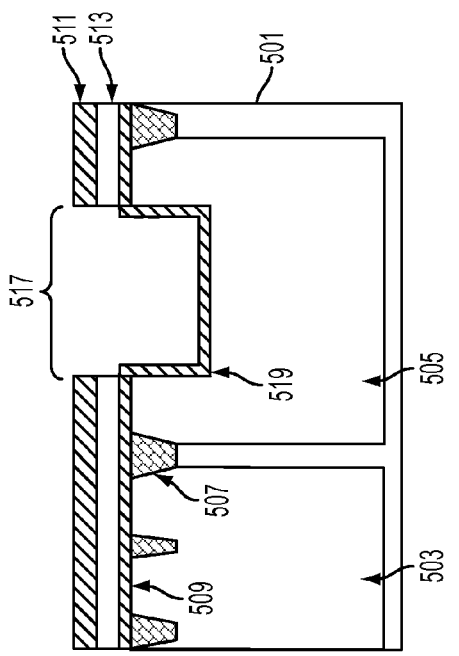
FIG. 5A
FIG. 5B
FIG. 5C
FIG. 5D

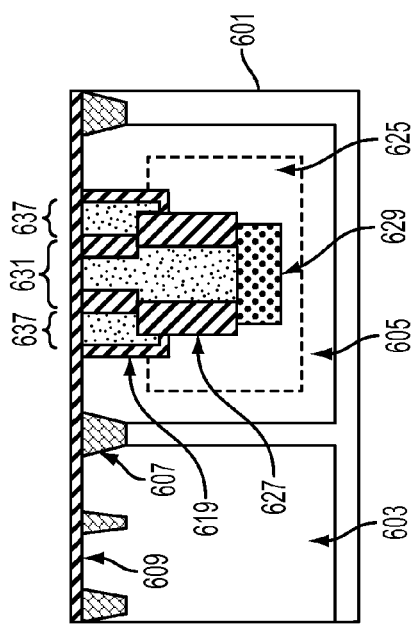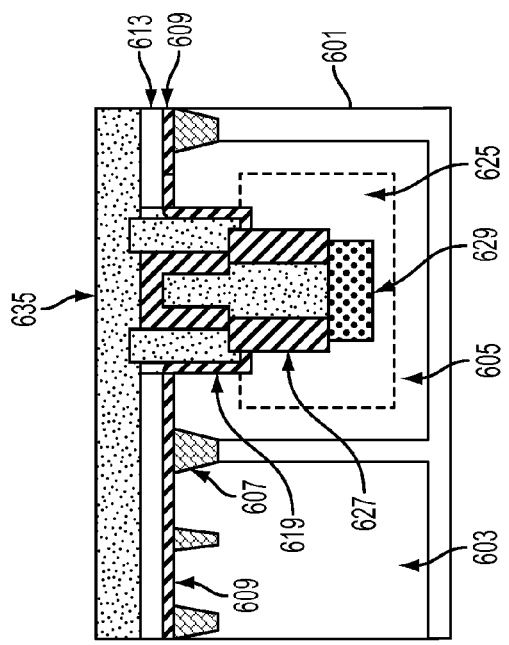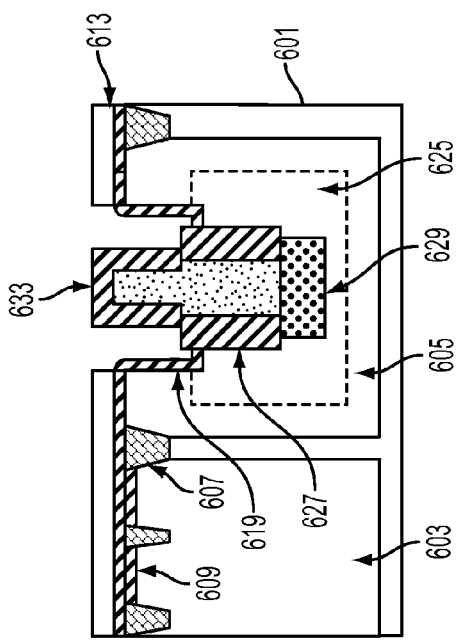

INTEGRATION OF TRENCH MOS WITH LOW VOLTAGE INTEGRATED CIRCUITS

TECHNICAL FIELD

The present disclosure relates to integration of high voltage (e.g., 30 V to 1000 V) trench metal oxide semiconductor (MOS) with low voltage integrated circuits. The present disclosure is particularly applicable to integrated trench MOS in 180 nanometer (nm) technology nodes and beyond.

BACKGROUND

Generally, for system-on-chip (SOC) applications, and more specifically, for power management of integrated circuits, it is becoming very important to have a cost-effective process which provides low voltage complementary MOS (CMOS) for logic, intermediate (or medium) voltage devices for analog and high voltage devices for an output high voltage interface stage. These output stages typically require high-speed switches and high package density, which further require low on-resistance (e.g., low $Rds_{on}$), high package density, higher breakdown voltage (e.g., higher BVdss), and low Miller capacitance.

FIG. 1 illustrates a common high voltage lateral double-diffused metal oxide semiconductor (LDMOS) structure having a substrate 101 with shallow trench isolation (STI) regions 103, high voltage n-type double diffused drain (HVNDDD) region 105, high voltage p-well (PWHV) region 107, and n-doped well (DNWELL) region 109, along with power region 111, source region 113, drain region 115, and gate stack 117. Although the structure is able to operate with high voltages (e.g., voltages higher than 20 V), it is typically unable to achieve sufficiently low on-resistance even when the breakdown voltage is low (e.g., the structure generally cannot achieve less than 6 mOhm-cm$^2$ $Rds_{on}$ even when the BVdss is allowed to drop down to 15 V). Moreover, the integration density of the particular LDMOS structure is not very high, and improvement of the channel density of the LDMOS, which reduces the on-resistance, is subject to certain limitations because the expanded drain region 115 of the LDMOS is formed along the substrate surface. Thus, low efficiency of the power supply results, and a large package with low thermal resistance becomes necessary to realize extremely low on-resistance for the power integrated circuits (ICs).

FIG. 2 illustrates a dual poly-filled LDMOS, which has been proposed to overcome the packing density limitation, as well as the decreasing $Rds_{on}$, of a common LDMOS structure (e.g., the structure in FIG. 1). The structure in FIG. 2 includes a substrate 201 with a P$^-$ doped region 203, an N$^-$ doped region 205, an N$^+$ doped region 207, oxide 209, a drain region 211, gate regions 213, oxide spacers 215, source regions 217, body contact regions 219, and STI regions 221. However, as shown by indicator 223, there is no thick oxide that separates the gate regions 213 from the drain region 211, which may, for instance, cause the structure to become vulnerable to high gate to drain capacitances and, thus, cause a substantial decrease of the structure's switching speed. Moreover, indicator 225 depicts the gate oxide integrity (GOI) concern due to the silicon nitride (SiN) residue at the bottom of the oxide spacers 215. Additional concerns may, for instance, include breakdown voltage weak points (e.g., BVdss may remain low) due to the thin gate oxide at the drain side, resulting in lower power efficiency of the LDMOS structure. Furthermore, the LDMOS structure is typically provided as discrete devices (e.g., not integrated with low and medium voltage devices) on integrated circuits, limiting package density of those integrated circuits.

A need therefore exists for an effective integrated trench MOS, and enabling methodology.

SUMMARY

An aspect of the present disclosure is a method for integration of a high voltage trench MOS with low voltage integrated circuits.

Another aspect of the present disclosure is a high voltage trench MOS device formed through integration of trench MOS with low voltage integrated circuits.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: forming a first trench in a substrate, the first trench having a first width; forming a first oxide layer on side surfaces of the first trench; forming a second trench in the substrate, below the first trench, the second trench having a second width less than the first width; forming a second oxide layer on side and bottom surfaces of the second trench; forming spacers on sides of the first and second trenches; removing a portion of the second oxide layer from the bottom surface of the second trench between the spacers; filling the first and second trenches with a first poly-silicon to form a drain region; removing the spacers, exposing side surfaces of the first poly-silicon; forming a third oxide layer on the side surfaces and a top surface of the first poly-silicon; and filling a remainder of the first and second trenches with a second poly-silicon to form a gate region on each side of the drain region.

Aspects of the present disclosure include doping the substrate around the second trench, after forming the second trench, to form a drift region. Another aspect includes doping the substrate beneath the bottom surface of the second trench, after forming the spacers, to form an N$^+$ region. Additional aspects include: forming nitride spacers on the sides of the first trench after forming the first oxide layer; and forming the second trench using the nitride spacers as a hard mask. Further aspects of the present disclosure include forming a poly-silicon layer on the sides and bottom of the first and second trenches before forming the spacers. Some aspects include: forming the third oxide layer and a fourth oxide layer on side surfaces of the first and second trenches by respectively oxidizing the first poly-silicon and the poly-silicon layer; and removing the fourth oxide layer and the nitride spacers before filling the remainder with the second poly-silicon. Various aspects include: forming a fifth oxide layer on the substrate after filling the remainder with the second poly-silicon; and forming a low voltage transistor and/or a medium voltage transistor on the fifth oxide layer. Other aspects include: forming the second oxide layer to be 500 Å to 20,000 Å in thickness; and forming the third oxide layer to be 500 Å to 20,000 Å in thickness.

An additional aspect of the present disclosure is a device including: a gate region in a substrate; a drain region, in the substrate, proximate the gate region; and oxide in the substrate, wherein the oxide separates substantially all side surfaces of the drain region from the gate region and the substrate.

Aspects include a device having the gate region including an upper portion having a first width and a lower portion having a second width less than the first width. Another aspect includes a device having a first portion of the oxide between a first side of the gate region and the drain region being 500 Å to 20,000 Å in thickness. Additional aspects include a device having a second portion of the oxide beneath the upper portion of the gate region and between a second side, opposite the first side, of the gate region and the substrate being 500 Å to 20,000 Å in thickness. Other aspects include a device having an N+ region beneath the drain region.

Further aspects include a device having a low voltage transistor and/or a medium voltage transistor over the substrate and proximate the gate region. Some aspects include a device having a second gate region, in the substrate, proximate the drain region, wherein the oxide separates substantially all side surfaces of the drain region from the gate region, the second gate region, and the substrate. Other aspects include a device having the drain region be between the gate region and the second gate region.

Another aspect of the present disclosure includes: forming a first trench in a substrate, the first trench having a first width; forming a first oxide layer on side surfaces of the first trench; forming a second trench in the substrate, below the first trench, the second trench having a second width less than the first width; forming a second oxide layer on side and bottom surfaces of the second trench; forming spacers on sides of the first and second trenches; removing a portion of the second oxide layer from the bottom surface of the second trench between the spacers; filling the first and second trenches with a first poly-silicon to form a drain region; removing an upper portion of the spacers, leaving a lower portion of the spacers and exposing an upper portion of side surfaces of the first poly-silicon; forming a third oxide layer on the upper portion of the side surfaces and a top surface of the first poly-silicon; and filling a remainder of the first and second trenches with a second poly-silicon to form a gate region on each side of the drain region.

Further aspects include: forming nitride spacers on the sides of the first trench after forming the first oxide layer; forming the second trench using the nitride spacers as a hard mask; forming the third oxide layer by oxidizing the first poly-silicon; and removing the nitride spacers before filling the remainder with the second poly-silicon. An additional aspect includes forming the spacers to be 500 Å to 20,000 Å in thickness. Other aspects include: forming the second oxide layer to be 500 Å to 20,000 Å in thickness; and forming the third oxide layer to be 500 Å to 20,000 Å in thickness.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which:

FIGS. 6A through 6K schematically illustrate a process flow for providing an integrated trench MOS structure of FIG. 4, in accordance with an embodiment of the present disclosure.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

Figure 1:
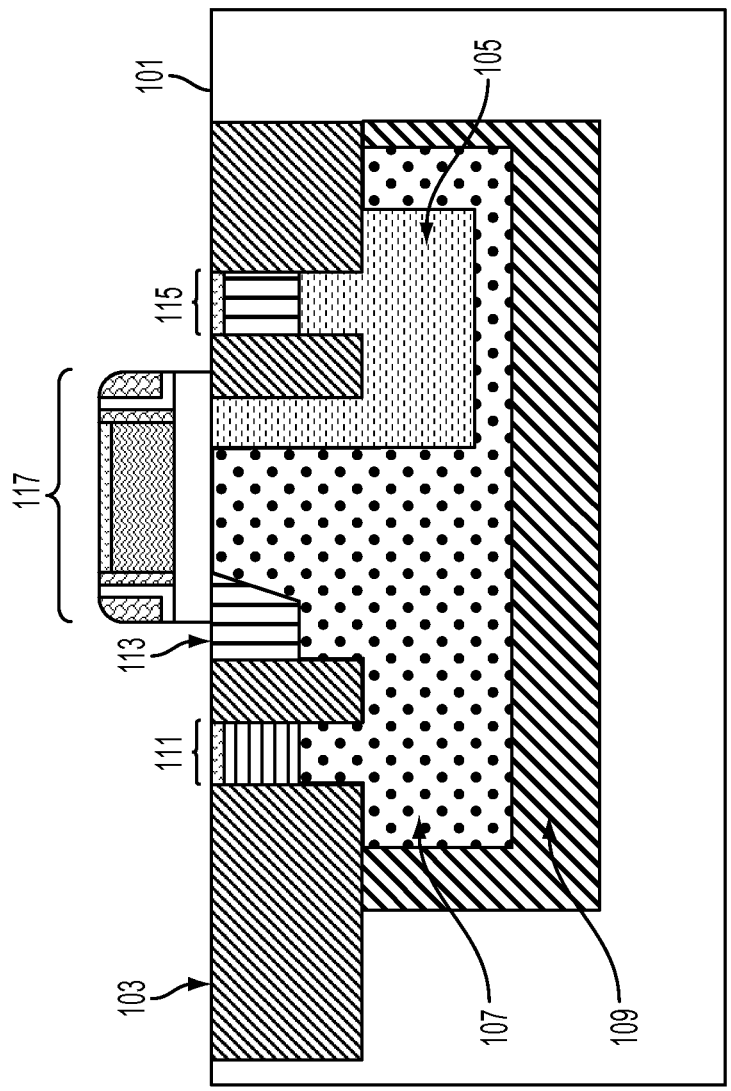
FIG. 1 schematically illustrates a background structure of a typical high voltage LDMOS.
Figure 2:
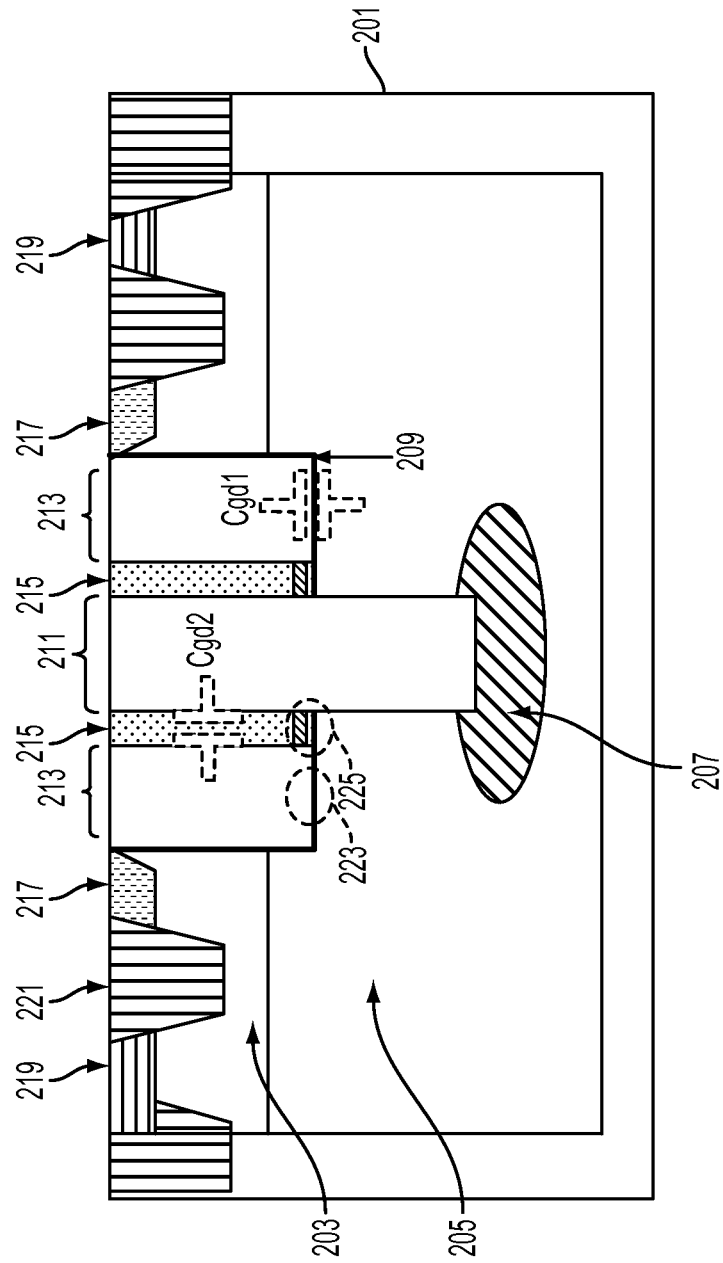
FIG. 2 schematically illustrates a background structure of a typical dual poly-filled LDMOS.

The present disclosure addresses and solves problems of low power efficiency and switching speeds of LDMOS structures and low package density attendant upon including such structures in integrated circuits. The present disclosure addresses and solves such problems, for instance, by, inter alia, forming a gate region in a substrate; forming a drain region, in the substrate, proximate the gate region; and forming oxide in the substrate, wherein the oxide separates (e.g., with thick oxide) substantially all side surfaces of the drain region from the gate region and the substrate, thereby mitigating, or eliminating, the above-described concerns with respect to FIGS. 1 and 2.

Figure 3:
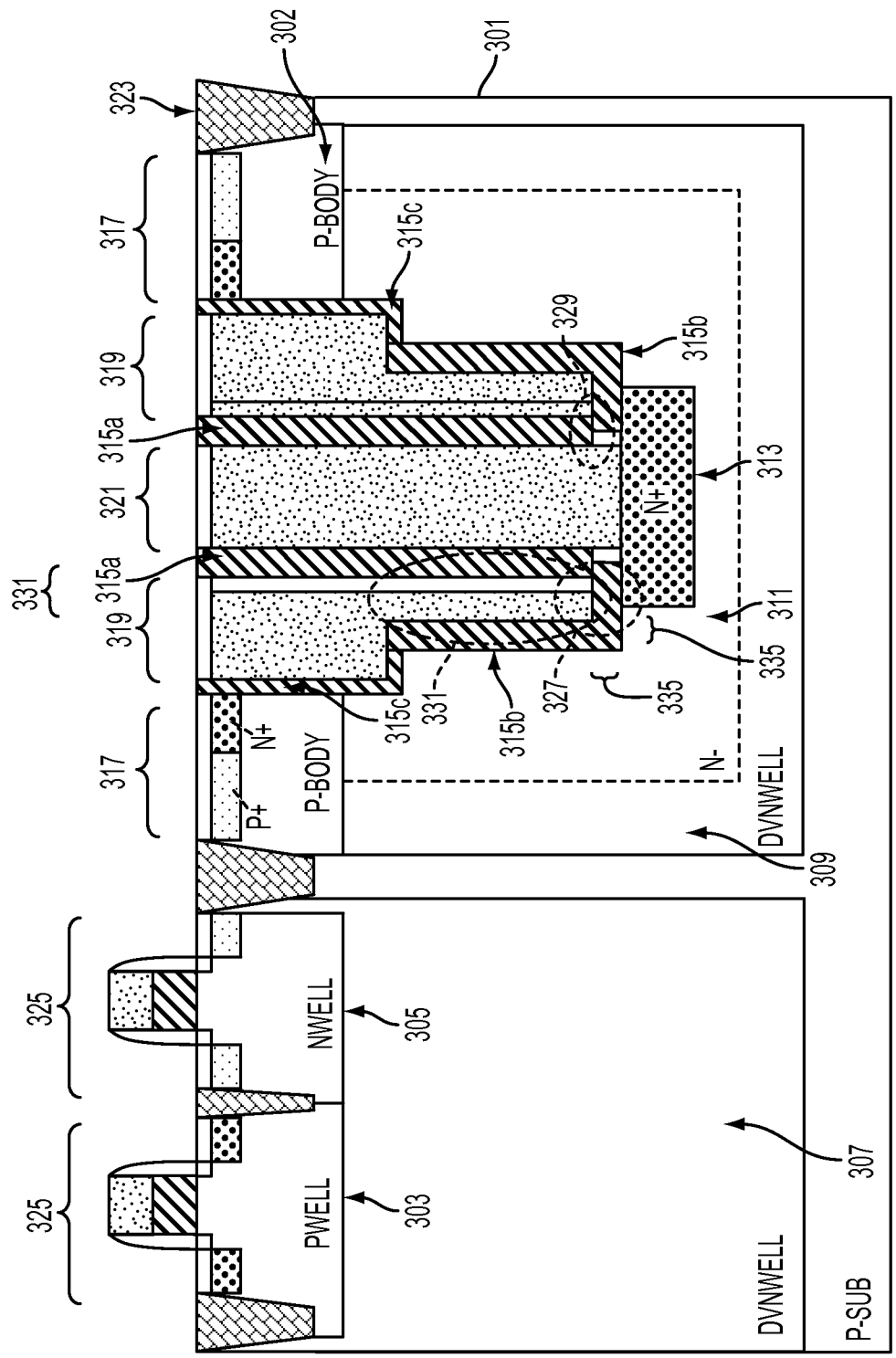
FIG. 3 schematically illustrates an integrated trench MOS structure, in accordance with an embodiment of the present disclosure.

FIG. 3 schematically illustrates an integrated trench MOS structure, in accordance with an embodiment of the present disclosure. The structure shown in FIG. 3 includes substrate 301, body regions 302, well regions 303, 305, 307, and 309, drift region 311 (e.g., N− drift region), N+ region 313, oxide 315, source regions 317, gate regions 319, drain region 321, STI regions 323, and low and/or medium voltage transistors 325. As shown by indicator 327, there is thick oxide (e.g., oxide 315) separating the gate region (or regions) 319 from the drain region 321, reducing any gate to drain capacitances and, thus, reducing related impacts on the trench structure's switching speeds. Moreover, as depicted by indicator 329, the structure's thick oxide eliminates (or mitigates) the SiN residue problem existing with the structure in FIG. 2. In addition, as illustrated by indicator 331, the lower, thinner portion of the gate region 319 between the thick oxide may act as a field plate to introduce a reduced surface field (RESURF) effect that reduces $Rds_{on}$.

By way of example, the portion of the oxide 315a between the gate region 319 (e.g., the left gate region 319) and the drain region 321 may be 500 Å to 20,000 Å in thickness (e.g., measurement 333), and the portion of the oxide 315b between the gate region 319 (e.g., the left gate region 319) and the substrate 301 (e.g., the region of the substrate 301 to the left of the left gate region 319) may be 500 Å to 20,000 Å in thickness (e.g., measurements 335), and the portion of the oxide 315c between the gate region 319 (e.g., the left gate region 319) and the substrate 301 (e.g., the region of the substrate 301 to the left of the left gate region 319) may be 20 Å to 1000 Å in thickness. As depicted, the gate region 319 includes an upper portion having a first width and a lower portion having a second width less than the first width. Additionally, part of the upper portion exists in the drift region 311, and the entire lower portion exists in the drift region 311.

Figure 4:
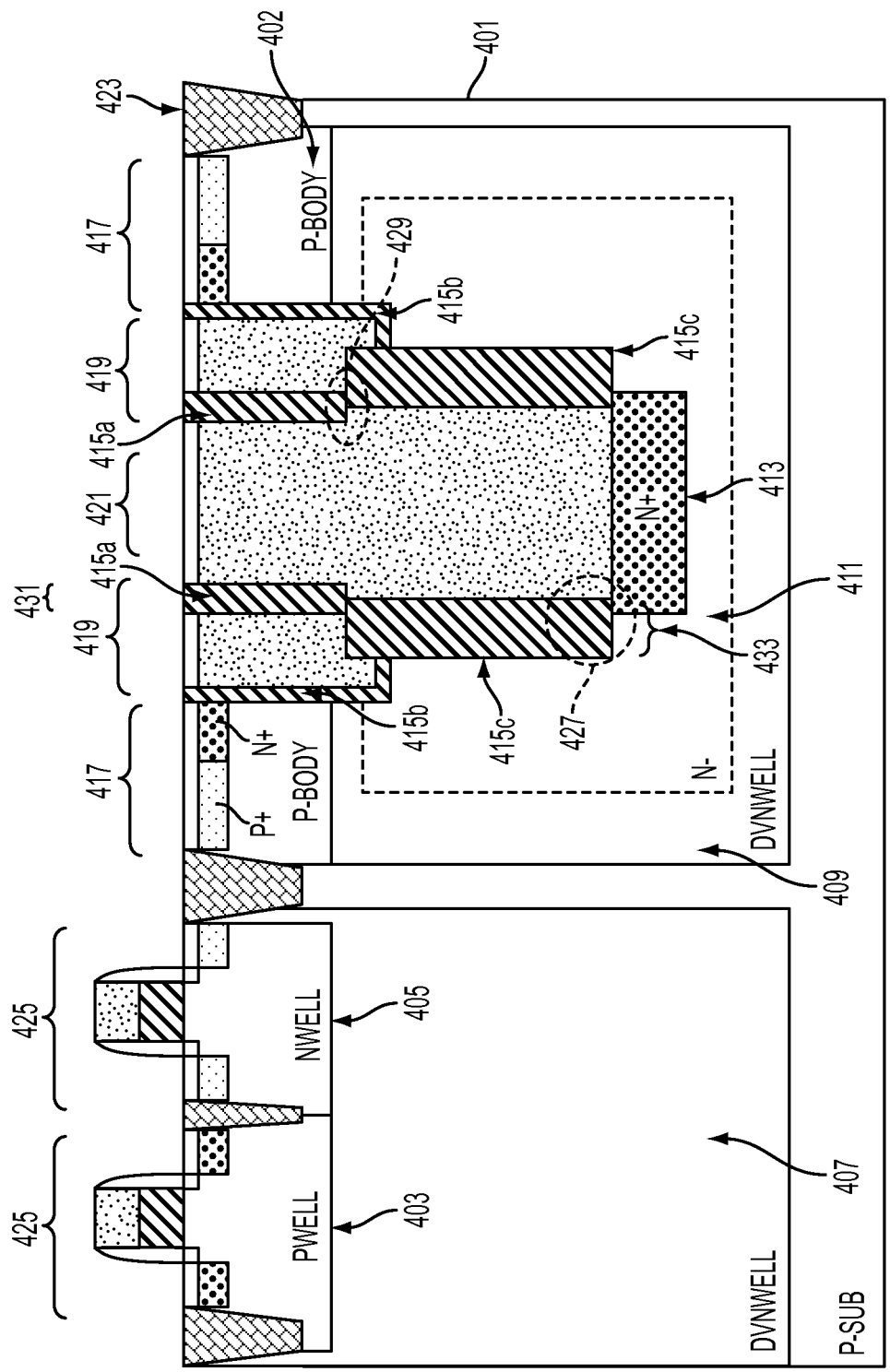
FIG. 4 schematically illustrates another integrated trench MOS structure, in accordance with an embodiment of the present disclosure.

FIG. 4 schematically illustrates another integrated trench MOS structure, in accordance with an embodiment of the present disclosure. The structure shown in FIG. 4 includes substrate 401, body regions 402, well regions 403, 405, 407, and 409, drift region 411 (e.g., $N^-$ drift region), $N^+$ region 413, oxide 415, source regions 417, gate regions 419, drain region 421, STI regions 423, and low and/or medium voltage transistors 425. As shown by indicator 427, there is thick oxide (e.g., oxide 415) separating the gate region (or regions) 419 from the drain region 421, reducing any gate to drain capacitances and, thus, reducing related impacts on the trench structure's switching speeds. Moreover, as depicted by indicator 429, the structure's thick oxide eliminates (or mitigates) the SiN residue problem existing with the structure in FIG. 2.

Similarly to FIG. 3, the structure in FIG. 4 illustrates that the portion of the oxide 415a between the gate region 419 (e.g., the left gate region 419) and the drain region 421 may be 500 Å to 20,000 Å in thickness (e.g., measurement 431). In addition, the portion of the oxide 415b between the gate region 419 and the substrate 401 (e.g., the region of the substrate to the left of the left gate region 419) may be 20 Å to 1000 Å in thickness, and the portion of the oxide 415c between the drain region 421 and the substrate 401 may be 500 Å to 20,000 Å in thickness.

Figure 5E:
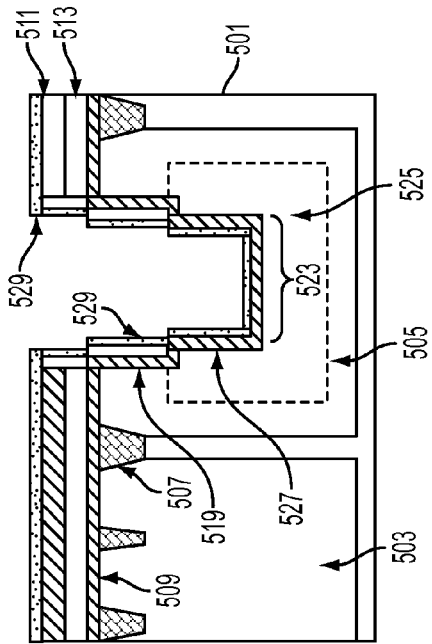
FIGS. 5A through 5P schematically illustrate a process flow for providing an integrated trench MOS structure of FIG. 3, in accordance with an embodiment of the present disclosure.
Figure 5G:
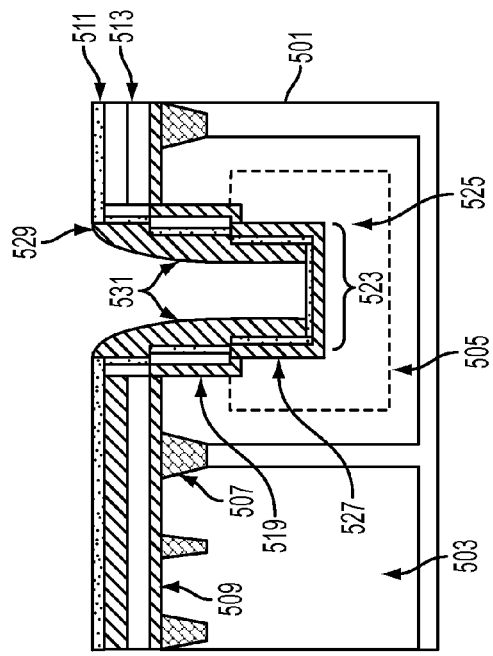
Figure 5F:
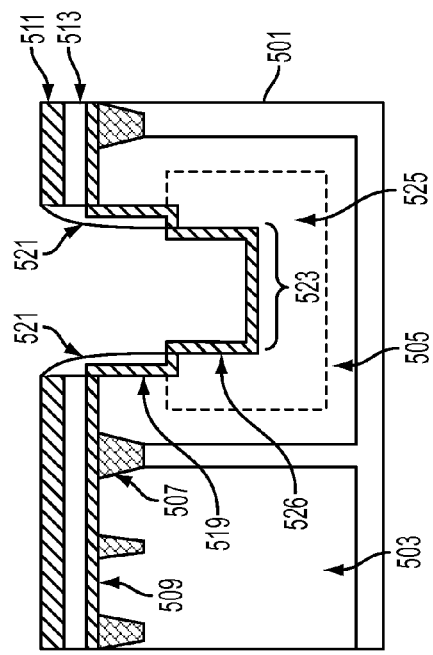
Figure 5H:
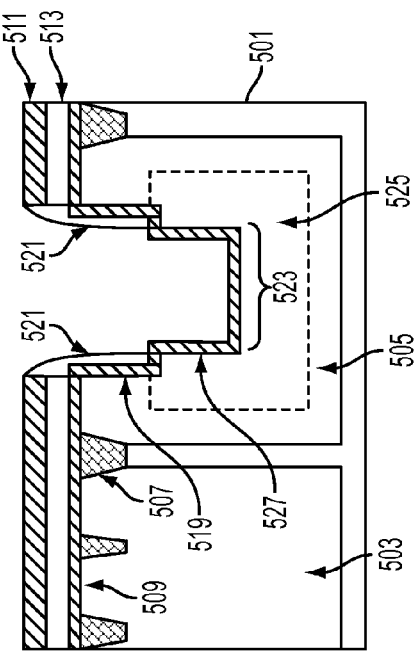
Figure 5I:
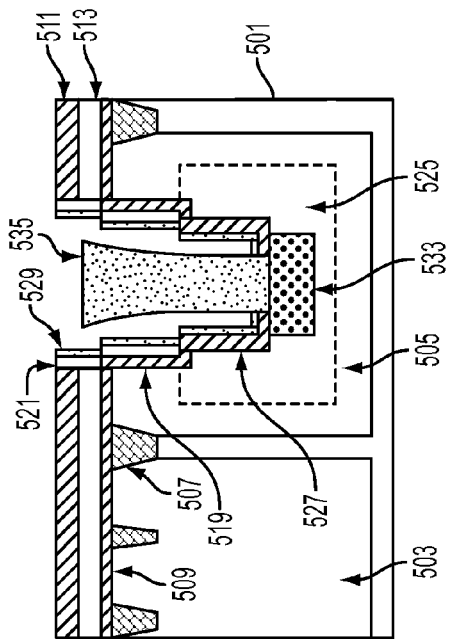
Figure 5K:
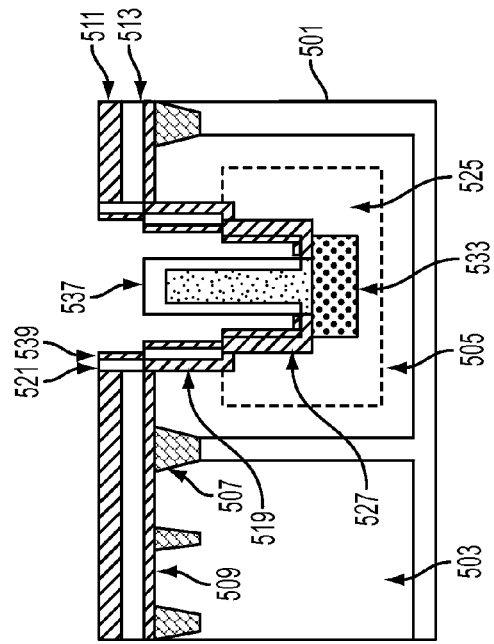
Figure 5J:
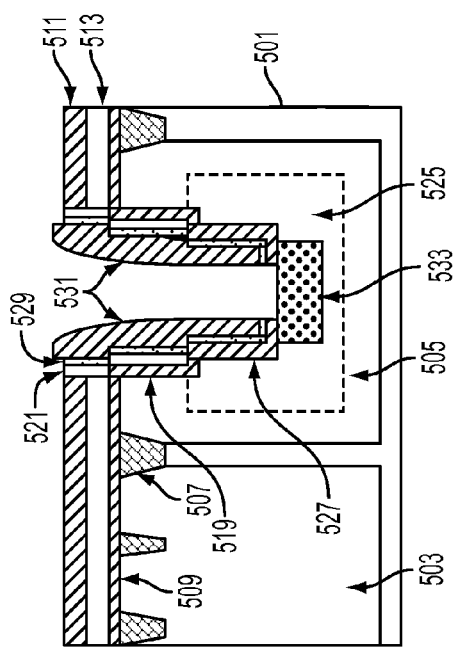
Figure 5L:
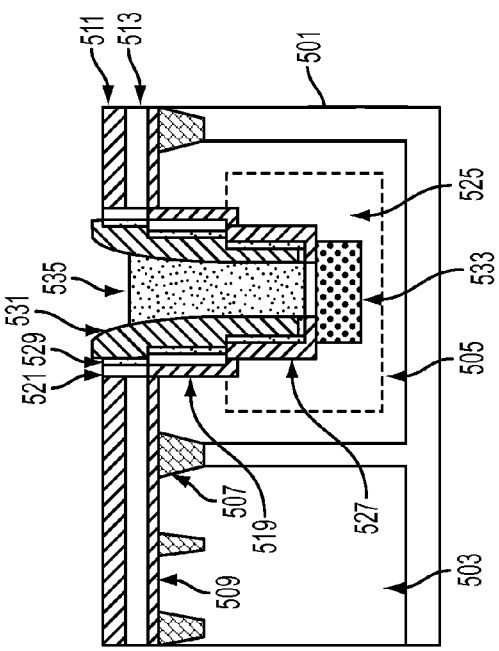
Figure 5M:
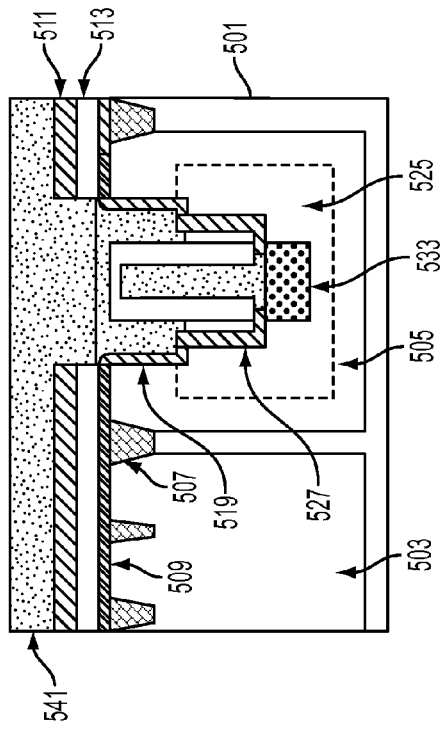
Figure 5O:
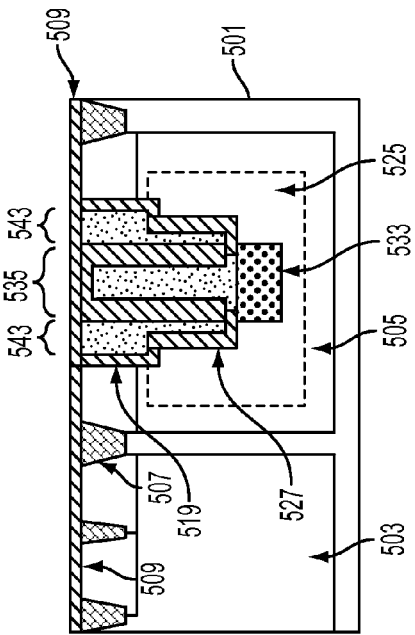
Figure 5N:
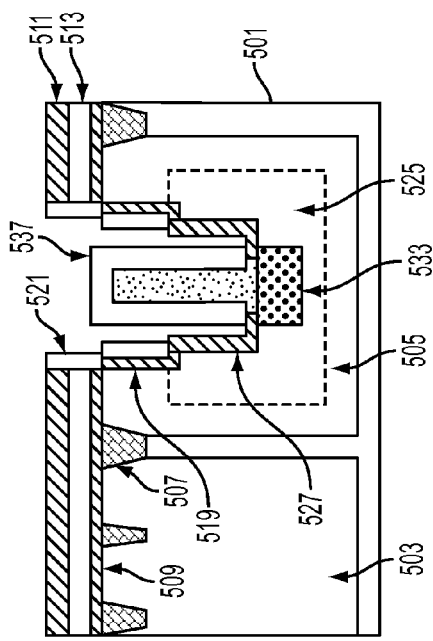
Figure 5P:
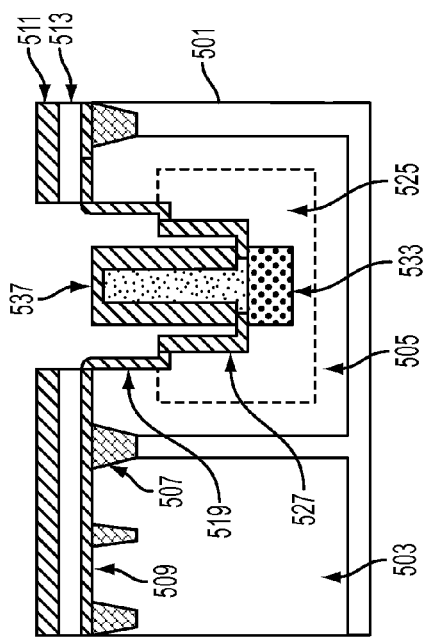

FIGS. 5A through 5P schematically illustrate a process flow for providing an integrated trench MOS structure of FIG. 3, in accordance with an embodiment of the present disclosure. Adverting to FIG. 5A, conventional processing may be performed to provide substrate 501, well regions 503 and 505, STI regions 507, and oxide layer 509. As shown, an oxide/nitride hard mask (e.g., including oxide layer 511 and nitride layer 513) is patterned with a photo mask (not shown for illustrative convenience) to define a trench opening 515, having a width of, for example, 1000 nm to 10000 nm. FIG. 5B illustrates the formation of a first vertical trench 517, e.g., with a depth of 0.5 um to 0.25 um (depending on the voltage of operation), by, for instance, etching the substrate 501. A sacrificial oxide may then be grown and etched off to clear any damage on the side walls of the first trench 517 prior to any high quality gate oxide growth. After the etching, a thin oxide layer 519, e.g., having a thickness of 20 Å to 1000 Å (depending on the voltage of operation of the trench MOS), may be grown on the side walls and bottom surface of the first trench 517.

FIG. 5C illustrates deposition of a nitride layer, e.g., to a thickness of 200 Å to 4000 Å, for instance, to protect the side wall portions of the oxide layer 519 from subsequent processing. The deposited nitride may then be etched (e.g., by a blank etch) to form nitride spacers 521 (e.g., SiN spacers). FIG. 5D illustrates the formation of a second trench 523, for example by etching to a depth of 1000 nm to 5000 nm, using the nitride spacers 521 as a hard mask.

As shown in FIG. 5E, the substrate is subsequently doped by, for instance, implanting an $N^-$ dopant in the substrate 501 to form drift region 525. In addition, a thin oxide layer 526, e.g., having a thickness of 100 Å to 1000 Å, may be grown on the side walls and bottom surface of second trench 523. As illustrated in FIGS. 5F and 5G, a thick oxide layer 527, e.g., 500 Å to 20,000 Å in thickness, is grown in trench 523, and then a thin poly-silicon layer 529 is deposited, e.g., to a thickness of 100 Å to 300 Å, on the sidewalls and bottom surface of trenches 517 and 523. FIG. 5H illustrates the deposition of a thick layer of oxide, e.g., 500 Å to 20,000 Å in thickness, that is subsequently etched to form oxide spacers 531 on the trench side walls.

FIG. 5I illustrates doping of the substrate 501 beneath the bottom surface of the second trench 523 to form $N^+$ region 533, for instance, by implanting $N^+$ dopant beneath the second trench 523. It is noted that this highly doped $N^+$ region 533 may be utilized to form part of the drain contact. As shown in FIG. 5J, poly-silicon, e.g., $N^+$ doped poly-silicon, is then deposited and planarized, filling the second trench 523 and a portion of the first trench 517 between the oxide spacers 531, to form drain region 535. The poly-silicon will connect to the heavily doped $N^+$ region to form drain connection.

As depicted in FIG. 5K, the oxide spacers 531 are then removed, for instance, by etching (e.g., a wet chemical etch). FIG. 5L then illustrates the oxidation of the poly-silicon of the drain region 535 to form thick oxide layer 537, e.g., 500 Å to 20,000 Å in thickness, on the poly-silicon. Additionally, the thin poly-silicon layer 529 is converted to oxide to form oxide layer 539.

FIG. 5M illustrates the subsequent stripping of the oxide layers, removing the oxide layer 539 (e.g., which was previously the thin poly-silicon layer 529), for example, by wet etch. As shown in FIG. 5N, the nitride spacers 521 are then etched away, for instance, using a wet chemical etch process.

Adverting to FIGS. 5O and 5P, poly-silicon 541 is deposited and then planarized by chemical mechanical polishing (CMP) or etch-back, using the nitride layer 513 as an etch-stop, forming the gate regions 543. Layer 513 is removed. As shown, the poly-silicon 541 may, for instance, then be oxidized to form the portion of the sacrificial oxide 509 over the drain and gate regions 535 and 543. Further processing is then performed to provide the structure in FIG. 3, which may, for instance, include removal of the sacrificial oxide 509, formation of low and/or medium voltage transistors, and doping of the substrate 501 (e.g., by $N^+$ implantation) to form the source regions and body contacts. Formation of the low and/or medium voltage transistors may include formation of gate oxide (using a mask), deposition of additional poly-silicon, e.g., to a thickness of 1500 Å to 2500 Å, formation of the respective gates by mask definition, formation of gate spacers, etc.

Figure 6A:
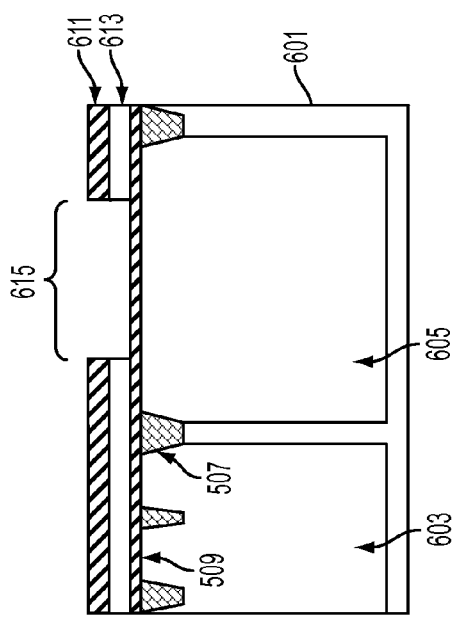
Figure 6B:
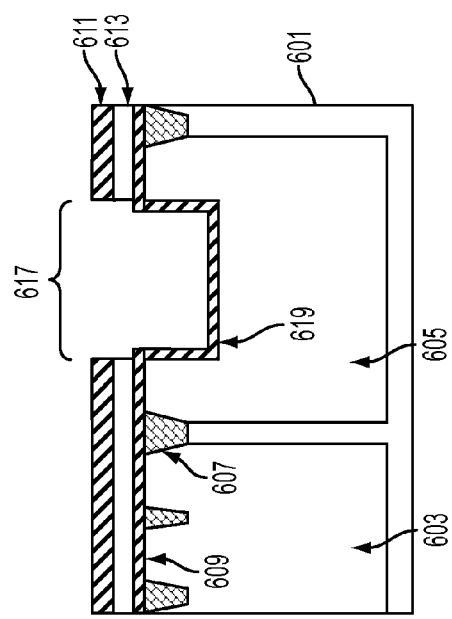

FIGS. 6A through 6K schematically illustrate a process flow for providing an integrated trench MOS structure of FIG. 4, in accordance with an embodiment of the present disclosure. Adverting to FIG. 6A, conventional processing may be performed to provide substrate 601, well regions 603 and 605, STI regions 607, and oxide layer 609. As shown, an oxide/nitride hard mask (e.g., including oxide layer 611 and nitride layer 613) is patterned with a photo mask (not shown for illustrative convenience) to define a trench opening 615. FIG. 6B illustrates the forming of a first vertical trench 617, e.g., with a depth of 0.5 um to 0.25 um (depending on the voltage of operation), for instance, by etching the substrate 601. A sacrificial oxide may then be grown and etched off to clear any damage on the side walls of the first trench 617 prior to any high quality gate oxide growth. After the etching, a thin oxide layer 619, e.g., 100 Å to 1000 Å in thickness (depending on the voltage of operation of the trench MOS) may be grown on the side walls and bottom surface of the first trench 617.

Figure 6C:
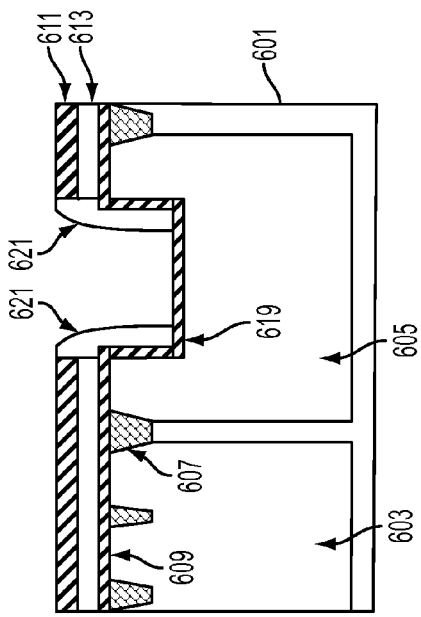
Figure 6D:
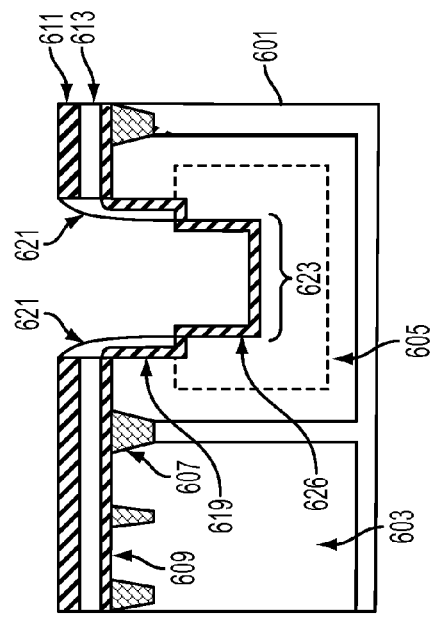

FIG. 6C illustrates deposition of a nitride layer, e.g., 200 Å to 4000 Å in thickness, for instance, to protect the side wall portions of the oxide layer 619 from subsequent processing. The deposited nitride may then be etched (e.g., by a blank etch) to form nitride spacers 621 (for example, SiN spacers). FIG. 6D illustrates the formation of a second trench 623 using the nitride spacers 621 as a hard mask. The substrate is doped, for instance, by implanting N⁻ dopant in the substrate 601 to form drift region 625. Further, a thin oxide layer 626, e.g., having a thickness of 100 Å to 1000 Å, may be grown on the side walls and bottom surface of second trench 623.

Figure 6E:
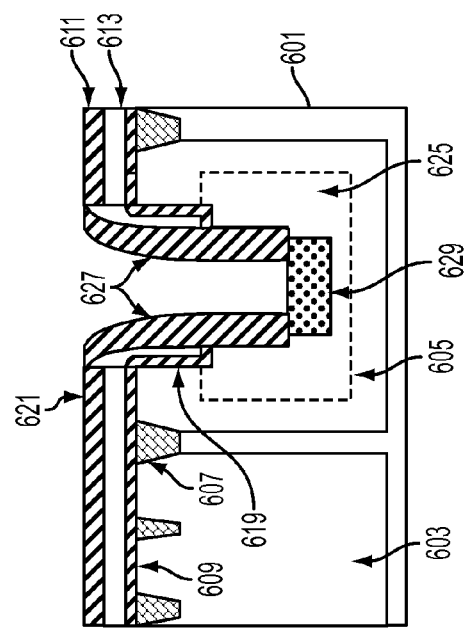
Figure 6F:
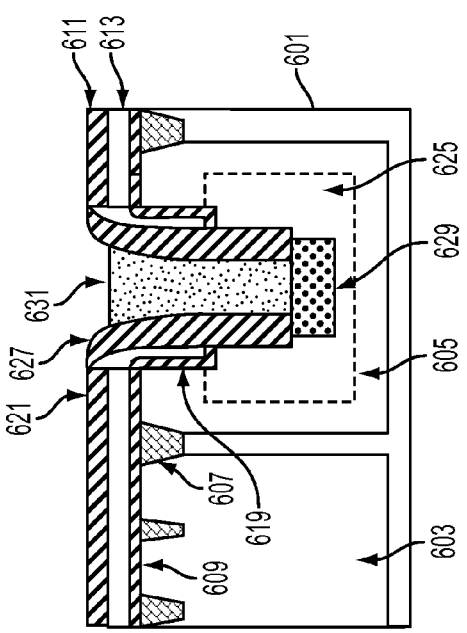

FIG. 6E illustrates the deposition of a thick layer of oxide (e.g., 500 Å to 20,000 Å in thickness) that is subsequently etched to form oxide spacers 627 on the trench side walls. Moreover, a portion of the substrate 601, beneath the bottom surface of the second trench 623 is doped to form N⁺ region 629, for instance, by implanting N⁺ dopant beneath the second trench 623. It is noted that this highly doped N⁺ region 629 may be utilized to form part of the drain contact. As shown in FIG. 6F, poly-silicon (e.g., N⁺ doped poly-silicon) is then deposited and planarized, filling the second trench 623 and a portion of the first trench 617 between the oxide spacers 627, to form drain region 631. The poly-silicon will connect to the heavily doped N⁺ region to form drain connection.

Figure 6G:
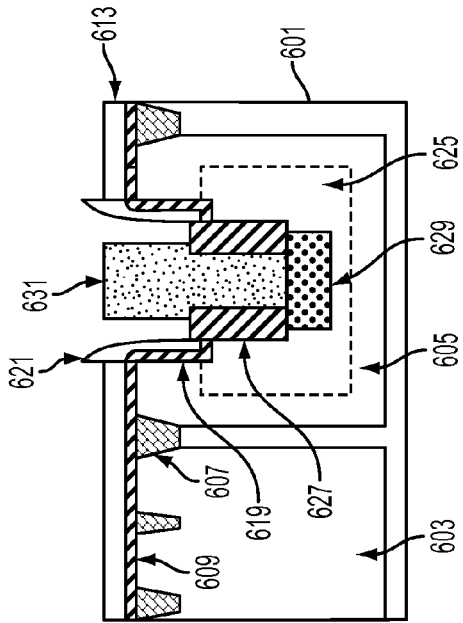
Figure 6H:
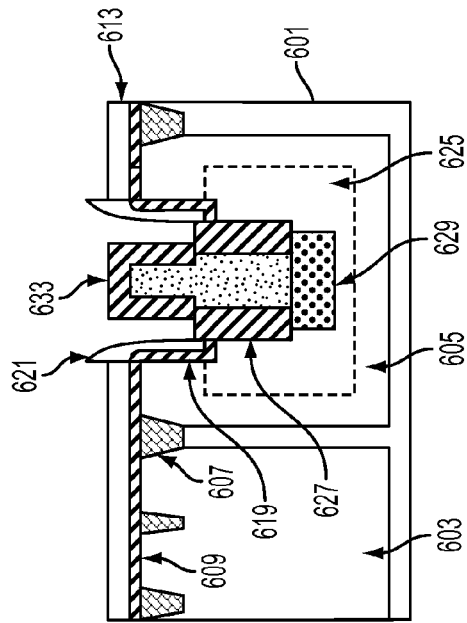

FIG. 6G illustrates, for instance, a wet etching process that removes an upper portion of the oxide spacers 627, for example to a depth of 500 nm to 1000 nm, leaving a lower portion of the oxide spacers 627. This currently removes the oxide layer 611. The lower portion has an upper surface higher than the bottom surface of the first trench. Adverting to FIG. 6H, the exposed surface of the poly-silicon of the drain region 631 is oxidized to form thick oxide layer 633, e.g., 500 Å to 20,000 Å in thickness, on the poly-silicon.

As shown in FIG. 6I, the nitride spacers 621 are then etched away, for instance, using a wet chemical etch process. FIGS. 6J and 6K illustrate the deposition of poly-silicon 635, which is then planarized by CMP or etch-back, using the nitride layer 613 as an etch-stop, forming the gate regions 637. Layer 613 is removed. As shown, the poly-silicon 635 may, for instance, then be oxidized to form the portion of the sacrificial oxide 609 over the drain and gate regions 631 and 637. Further processing is then performed to provide the structure in FIG. 4, which may, for instance, include removal of the sacrificial oxide 609, formation of low and/or medium voltage transistors, and doping of the substrate 601 (e.g., by N⁺ implantation) to form the source regions and body contacts. Formation of the low and/or medium voltage transistors may include formation of gate oxide, deposition of additional poly-silicon, e.g., 1500 Å to 2500 Å in thickness, formation of the respective gates by mask definition, formation of gate spacers, etc.

The embodiments of the present disclosure can achieve several technical effects, including higher power efficiency and higher switching speeds of LDMOS devices. Embodiments of the present disclosure enjoy utility in various industrial applications as, for example, microprocessors, smart phones, mobile phones, cellular handsets, set-top boxes, DVD recorders and players, automotive navigation, printers and peripherals, networking and telecom equipment, gaming systems, and digital cameras. The present disclosure therefore enjoys industrial applicability in any of various types of highly integrated semiconductor devices.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
    forming a first trench in a substrate, the first trench having a first width;
    forming a first oxide layer on side surfaces of the first trench;
    forming a second trench in the substrate, below the first trench, the second trench having a second width less than the first width;
    forming a second oxide layer on side and bottom surfaces of the second trench;
    forming spacers on sides of the first and second trenches;
    removing a portion of the second oxide layer from the bottom surface of the second trench between the spacers;
    filling the first and second trenches with a first poly-silicon to form a drain region;
    removing the spacers, exposing side surfaces of the first poly-silicon;
    forming a third oxide layer on the side surfaces and a top surface of the first poly-silicon; and
    filling a remainder of the first and second trenches with a second poly-silicon to form a gate region on each side of the drain region.

2. The method according to claim 1, comprising:
    doping the substrate around the second trench, after forming the second trench, to form a drift region.

3. The method according to claim 1, comprising:
    doping the substrate beneath the bottom surface of the second trench, after forming the spacers, to form a N⁺ region.

4. The method according to claim 1, comprising:
    forming nitride spacers on the sides of the first trench after forming the first oxide layer; and
    forming the second trench using the nitride spacers as a hard mask.

5. The method according to claim 1, comprising:
    forming a poly-silicon layer on the sides and bottom of the first and second trenches before forming the spacers.

6. The method according to claim 5, comprising:
    forming the third oxide layer and a fourth oxide layer on side surfaces of the first and second trenches by respectively oxidizing the first poly-silicon and the poly-silicon layer; and
    removing the fourth oxide layer and the nitride spacers before filling the remainder with the second poly-silicon.

7. The method according to claim 6, comprising:
    forming a fifth oxide layer on the substrate after filling the remainder with the second poly-silicon; and
    forming a low voltage transistor and/or a medium voltage transistor on the fifth oxide layer.

8. The method according to claim 1, comprising:
    forming the second oxide layer to be 500 Å to 20,000 Å in thickness; and forming the third oxide layer to be 500 Å to 20,000 Å in thickness.

\* \* \* \* \*